United States Patent
Melzer

(10) Patent No.: US 7,580,207 B2
(45) Date of Patent: Aug. 25, 2009

(54) OPTICAL APPARATUS COMPRISING AN OPTICAL COMPONENT AND AN ADJUSTMENT DEVICE AND METHOD FOR INFLUENCING A POLARIZATION STATE OF THE OPTICAL COMPONENT

(75) Inventor: Frank Melzer, Utzmemmingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 404 days.

(21) Appl. No.: 11/383,012

(22) Filed: May 12, 2006

(65) Prior Publication Data

US 2006/0279856 A1 Dec. 14, 2006

Related U.S. Application Data

(60) Provisional application No. 60/681,829, filed on May 16, 2005.

(51) Int. Cl.
*G02B 7/02* (2006.01)
*G02B 3/00* (2006.01)
(52) U.S. Cl. .................... 359/822; 359/819; 359/649
(58) Field of Classification Search ......... 359/649–653, 359/819–823
See application file for complete search history.

(56) References Cited

U.S. PATENT DOCUMENTS

| 1,269,422 | A | | 6/1918 | Gordon | 359/666 |
|---|---|---|---|---|---|
| 4,007,471 | A | * | 2/1977 | Land et al. | 396/544 |
| 4,372,984 | A | | 2/1983 | Bauer | 426/637 |
| 5,552,006 | A | | 9/1996 | Soliday et al. | 156/108 |
| 6,246,528 | B1 | | 6/2001 | Schachar | 359/666 |
| 6,307,688 | B1 | | 10/2001 | Merz et al. | 359/819 |
| 7,312,921 | B2 | * | 12/2007 | Terada et al. | 359/368 |
| 7,414,800 | B2 | * | 8/2008 | Isobe et al. | 359/811 |
| 2003/0095345 | A1 | | 5/2003 | Yoshida | 359/819 |

FOREIGN PATENT DOCUMENTS

JP 2001-284226 A 10/2001

* cited by examiner

*Primary Examiner*—Mohammed Hasan
(74) *Attorney, Agent, or Firm*—Darby & Darby P.C.

(57) ABSTRACT

An optical apparatus comprises an optical component having at least one optical surface and a first optical axis, a socket in which said optical component is mounted, first manipulators arranged to exert forces approximately parallel to the optical axis of the optical component for varying stresses in the optical component, the forces having a strength such that stress birefringence is induced in the component.

10 Claims, 4 Drawing Sheets

OPTICAL APPARATUS COMPRISING AN OPTICAL COMPONENT AND AN ADJUSTMENT DEVICE AND METHOD FOR INFLUENCING A POLARIZATION STATE OF THE OPTICAL COMPONENT

CROSS REFERENCE TO RELATED APPLICATION

The present application claims priority of U.S. provisional patent application of Ser. No. 60/681,829 filed on May 16, 2005.

BACKGROUND OF THE INVENTION

The invention relates to an optical apparatus comprising an optical component, in particular a lens, which is mounted in a socket and has at least one optical surface, wherein stresses within the component are set or can be varied by means of manipulators.

The invention further relates to a method for influencing a polarization state of an optical component of an illumination system and/or of a projection objective in a microlithographic projection exposure apparatus.

U.S. Pat. No. 6,307,688 B1 discloses the use of actuators for an optical component, in particular a lens, which act in the radial direction in order to produce pulling or pushing forces. In this case, T-shaped levers are used in the area between an inner holding ring, which holds the lens, and an outer socket, via which forces are introduced to the holding ring. The forces can also be produced piezoelectrically or by means of hydraulic units, instead of mechanical force production.

US 2003/0095345 A1 discloses holders for a lens, in which the lens is not held in radial direction, in order to prevent deformations.

A lens with a variable focal length is described in U.S. Pat. No. 6,246,528 B1. The lens comprises two optical boundary surfaces and, between them, a synthetic, elastically deformable and transparent refraction body, which can be stressed via actuators which act in the radial direction, for example by micrometer screws, on its side periphery. The lens is itself composed, for example, of piezoelectric material. Alternatively, a ring is used which surrounds the lens and is composed of a magnetostrictive material. A bimetallic ring can also be used, which changes its shape at a specific transition temperature. In the same way, hydraulic or pneumatic cylinders or magnet coils can also be used in order to influence the periphery of the refraction body. In one refinement of the lens (FIG. 8), provision is made for radially mounted manipulators to exert torques on the lens in the direction of the optical axis. The concept which is described in U.S. Pat. No. 6,246,528 B1 refers back to U.S. Pat. No. 1,269,422.

A stressed refraction mirror according to U.S. Pat. No. 5,552,006 comprises a stressing device with a large number of pneumatic cylinders, which are arranged distributed over the entire circumference of the side edge of the refraction mirror.

U.S. Pat. No. 4,327,984 describes a design with a lens, to which stress can be applied by means of radially aligned screws. Stress is also applied to a lens in the radial direction by means of a large number of clamping means according to JP 2001284226 A.

SUMMARY OF THE INVENTION

It is an object of the invention to provide an improved optical apparatus by which the imaging properties of an optical component can be influenced.

It is an further object of the invention to provide an improved optical apparatus by which the imaging properties in a projection exposure apparatus for microlithography can be influenced.

It is an further object of the invention to provide an improved optical apparatus by which the imaging properties of an illumination system of a projection exposure apparatus for microlithography can be influenced.

It is a further object of the invention to provide an improved optical apparatus by which the imaging properties of a projection objective of a projection exposure apparatus for microlithography can be influenced.

It is a further object of the invention to provide an improved optical apparatus by which the polarization state of a projection exposure apparatus for microlithography can be varied.

It is a further object of the invention to provide a method for influencing a polarization state of at least one optical component in a microlithographic projection exposure apparatus.

It is a further object of the invention to provide a method for influencing a polarization state of an illumination system of a microlithographic projection exposure apparatus.

It is a further object of the invention to provide a method for influencing a polarization state of an objective of a microlithographic projection exposure apparatus.

According to an aspect of the invention, an optical apparatus is provided, comprising an optical component having at least one optical surface and a first optical axis, a socket in which the optical component is mounted, first manipulators arranged to exert forces approximately parallel to the optical axis of the optical component for varying stresses in the optical component, the forces having a strength such that stress birefringence is induced in the component.

According to another aspect of the invention, a method for influencing a polarization state of at least one optical component in a microlithographic projection exposure apparatus, the at least one optical component having an optical axis, is provided, comprising exerting forces on the at least one optical component such that stress birefringence is induced in the at least one optical component.

BRIEF DESCRIPTION OF THE DRAWINGS

In the following, the invention will be explained in more detail using exemplary embodiments and with reference to the drawings, in which.

DETAILED DESCRIPTION OF THE INVENTION

Figure 1:
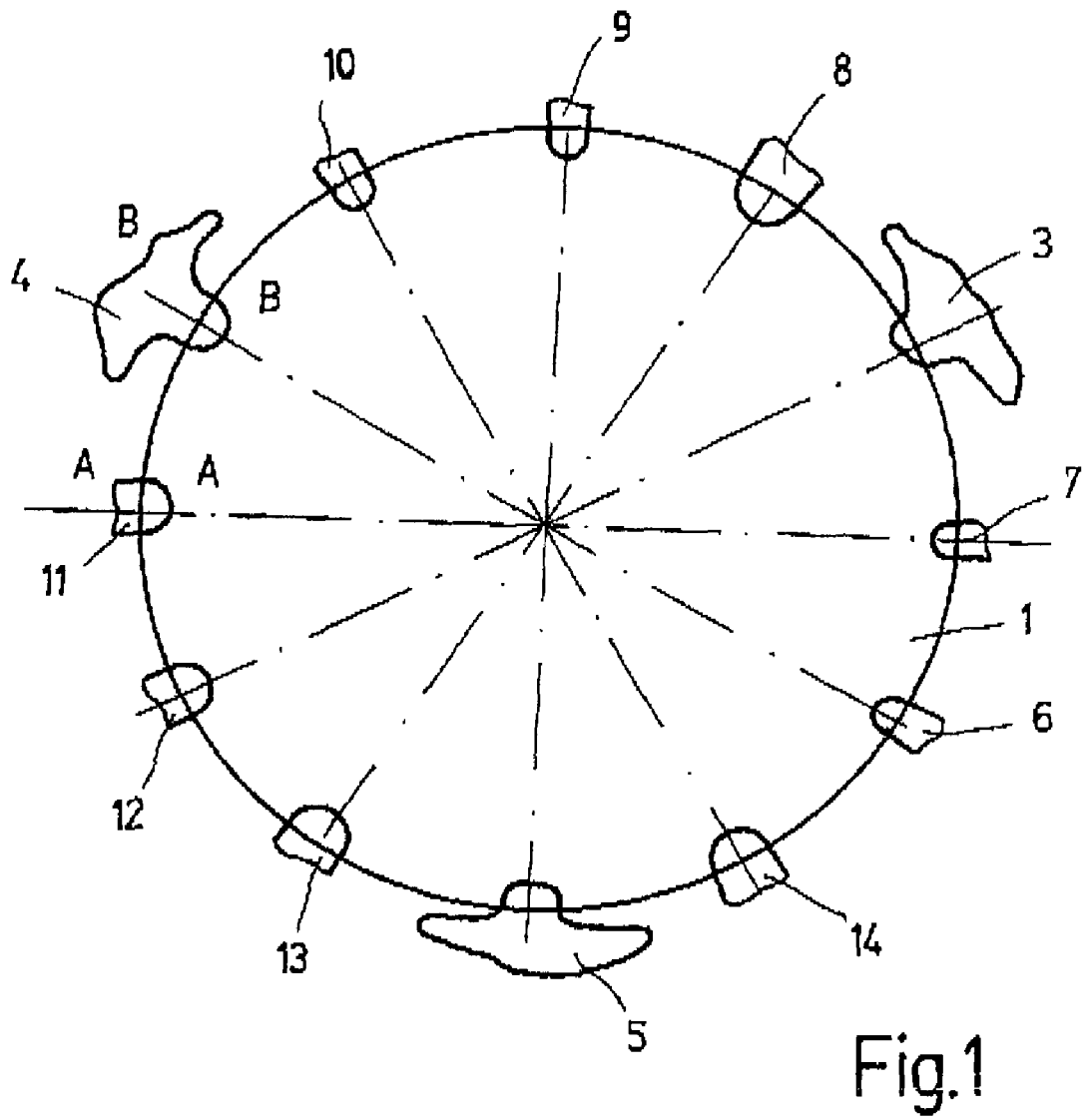
FIG. 1 shows a plan view of a lens with support points and manipulators.

The invention is based on the idea that, in contrast to the lenses with given stresses as known from the prior art, these stresses are varied deliberately in order in this way to produce different stress states in the lens. This makes it possible to cause stress birefringence, which causes specific polarization effects in the lens and thus in the optical system in which the lens is incorporated. According to the invention, active and passive manipulators are used as adjustment devices for adjustment or variation of the stress states within the optical component.

In this context, the optical component preferably is a lens or a plane plate, for example a λ/4-plate. The material of the optical component is chosen such that stress birefringence is induced in the component by the force and/or torque exerted. The optical component preferably is made of quartz or calcium fluoride or magnesium fluoride.

For the purposes of this invention, the expression "approximately parallel" should be understood as meaning that the manipulators exert forces in the peripheral area of the component and/or on a holder or socket which peripherally surrounds the component which result in a force ratio of 10 to 1, preferably 20 to 1 or more, when the forces are resolved in the direction of the optical axis and in the direction orthogonal to the optical axis. For the purposes of the present invention, and as an extension of the understanding of an optical axis of a refractive component, the optical axis of a plane-parallel plate is defined by at least one optical axis of the optical system which includes the plane-parallel plate, for example the illumination optics of an illumination system and/or the projection optics of a projection objective. The greater the extent to which the force which is exerted by the manipulators is parallel to the optical axis of the component, the greater is the force ratio of the resolved forces, wherein a force ratio as large as possible is preferred.

In a preferred embodiment of the invention, the component is a first optical component, and at least a second optical component is provided, wherein stresses within the second component are adjustable or alterable, and the manipulators exert forces and/or torques approximately parallel to the optical axis of the second component in the peripheral area on the second component itself or on a holder or socket which peripherally surrounds the second component, the strength of which is such that a scalar effect on the imaging properties are at least predominantly induced in the second component.

For the purposes of the invention, imaging properties of an optical component or a group of components are scalar imaging properties as well as imaging properties which are influenced by polarization.

When inducing stresses in an optical component in order to induce stress birefringence, the scalar imaging properties of the optical component as well as the imaging properties of same which depend on polarization, are varied.

If the polarization behavior of the optical component is varied by an induced stress birefringence, the scalar imaging properties of same, as a consequence, are varied, too. In the present embodiment of the present invention, in order to not produce an alteration of the scalar imaging properties of the illumination system and/or projection objective of a projection exposure apparatus when the polarization properties of same are varied, scalar imaging defects induced in the first component are compensated by the fact that at least predominantly the scalar imaging properties of the second component are varied. In this context, the scalar effect is preferably induced in the second component with the same amount, but opposite sign as in the first component. The second component preferably is a component which is easierly deformable than the first component.

Further, temperature dependent variations of the imaging properties in a projection exposure apparatus can also be compensated for by deformation of the at least one second component.

It is conceivable to provide a plurality of first components in which stress birefringence is induced. In this case, in order to maintain the scalar imaging properties, a plurality of second components is provided, if necessary, in which predominantly the scalar imaging properties are manipulated.

In a further preferred embodiment, the forces onto the first component are in a range of about 1 to about 10 N, and/or the torques onto the first component are in a range of about 0.5 to about 1 Nm.

The stress birefringence induced in the first optical component depends on the matter constant of the material of which the first component is made, and on the exerted forces and/or torques. In this context, the forces and/or torques are also influencible during use of the projection exposure apparatus. Influencing of stress birefringence by the matter constants of the first component is possible by exchanging the first component.

In a further preferred embodiment, the exertion of the forces and/or torques in the second component is lower than or equal to the exertion of the forces and/or torques in the first component, and/or another matter constant and/or another shape is used for the second component than for the first component.

When exerting lower forces onto the second component, the second component is only subject to a deformation which has a scalar effect on the imaging properties, whereas the first component is subject to a scalar as well as to a polarization dependent variation of the imaging properties.

In a further preferred embodiment, the first component comprises a material having a lower strain-optical coefficient than the second component.

The strain-optical coefficient is a matter constant and results from the variation of the refractive index n of the material when stress is applied, wherein the variation of the refractive index is different for both wave mode directions and is defined as follows:

$$K = d \cdot \sigma / \Delta s,$$

wherein σ is a mechanical stress, d a mechanical light path length and Δs an optical path difference for the passage of light through an optical component having a predetermined strain-optical coefficient. In this context, σ is positive for a tensile stress.

Thus, the strain-optical coefficient is a measure for the sensitivity of a specific material to exerted forces. This includes the produced deformation and the induced stress birefringence in the respective component.

The strain-optical coefficient is in the order of $(1\text{-}4 \times 10^{-6} \text{ mm}^2/\text{N})$ for most of glasses. The strain-optical coefficient of quartz, for example, is larger than the strain-optical coefficient of calcium fluoride or magnesium fluoride.

By using materials for the first and the second component which have different strain-optical coefficients, a different deformation can be induced when the same force and/or torque is exerted. In case the second component has a larger strain-optical coefficient than the first component, the second component is more sensitive to the exertion of forces and/or torques, and the result is a larger deformation of the second component for the same exertion of forces and/or torques.

An embodiment is advantageous in which the manipulators are arranged at least on one side with respect to the optical surface on the first and/or second component or on the holder thereof.

If the manipulators are provided on both sides of the optical surface, they are arranged either opposite one another or offset with respect to one another.

At least some of the manipulators are advantageously in the form of active manipulators, in which case the force and/or torque which is exerted by the manipulators can be adjusted by means of actuators, for at least some of the manipulators.

The actuators advantageously exert mechanical, electrostatic or magnetostatic forces and/or torques on the peripheral area of the component or on the holder. Piezoelectric components, by way of example, are used in order to produce the electrostatic forces.

Adjustable springs, or pneumatic or hydraulic cylinders, can be used in particular as mechanical actuators.

The stresses can be introduced into the first and/or second component even during assembly or, in particular, when actuators are provided, can be varied during operation without renewed adjustment. By variation of the number of manipulators distributed on the circumference it is possible to achieve indefinitely fine manipulation capabilities to influence the stress birefringence.

It is also advantageous if additional manipulators are provided to additionally exert forces and/or torques in the radial direction of the first and/or second component on the respective component in the peripheral area of the component itself or on a holder or socket which peripherally surrounds the component, with these forces being exerted essentially orthogonal to the optical axis.

Radially exerted forces or torques predominantly produce scalar effects on the optical properties of the components.

A refinement to the component is likewise advantageous in which additional devices are provided in the peripheral area and exert forces in the radial direction on the component itself or on a holder or socket which peripherally surrounds the component, with these forces being exerted essentially radial to the optical axis.

For the purposes of this invention, the expression "essentially radial to the optical axis" should be understood as meaning that the manipulators exert forces in the peripheral area of the respective component and/or on a holder or socket which peripherally surrounds the respective component, which forces result in a force ratio of 10 to 1, preferably 20 to 1 or more, when the forces are resolved in the direction of a radial axis and in the direction orthogonal thereto. The greater the extent to which the force which is exerted by these manipulators or the force which is exerted by the additional devices is parallel to a radial axis of the component, the greater is the force ratio of the resolved forces, in which case it is preferable to introduce the forces into the component approximately parallel.

At least one first and/or second component according to the invention can be used in a projection exposure apparatus for microlithography.

The invention further relates to a method for influencing the polarization state of at least one optical component of an illumination system and/or a projection objective in a microlithographic projection exposure apparatus, wherein the optical component is varied by exerting forces and/or torques on the component such that stress birefringence is induced in the component.

In a preferred embodiment of the method, forces and/or torques are exerted on at least one second component of the illumination system and/or of the projection objective such that a scalar effect on the imaging properties of the second component is produced in the second component, which at least partially compensates a scalar effect of the force and/or torque exertion on the first optical component.

In a preferred embodiment of the method, the force and/or torque exerted on the second component is lower than or equal to the force and/or torque exerted on the first component.

By virtue of the measures mentioned before, undesired scalar variations of the imaging properties, i.e. scalar imaging defects, which are produced in the first component, can be compensated. In case that imaging defects are produced in the first component which are of scalar nature as well as are polarization dependent, the scalar image defects can be compensated for in this way. In this case, a method is realized in which only those imaging properties are influenced in an illumination system and/or a projection objective, for example, which depend on polarization.

In a preferred embodiment of the method, the polarization state of the illumination system and/or the projection objective in the microlithographical projection exposure apparatus is influenced.

In particular, the method can be conducted in the field, i.e. at or by the user of the projection exposure apparatus.

In another preferred embodiment of the method, the strength of the forces onto the first component is in a range of about 1 to about 10 N, and/or the exerted torques are in a range of about 0.5 to about 1 Nm.

These values are valid for quartz, for example.

In another preferred embodiment of the method, the first component comprises a material having a lower strain-optical coefficient than the second component.

The first and the second component are differently sensitive to the same force and/or torque exertion. Quartz comprises a high strain-optical coefficient which is higher than that of calcium fluoride.

Figure 2:
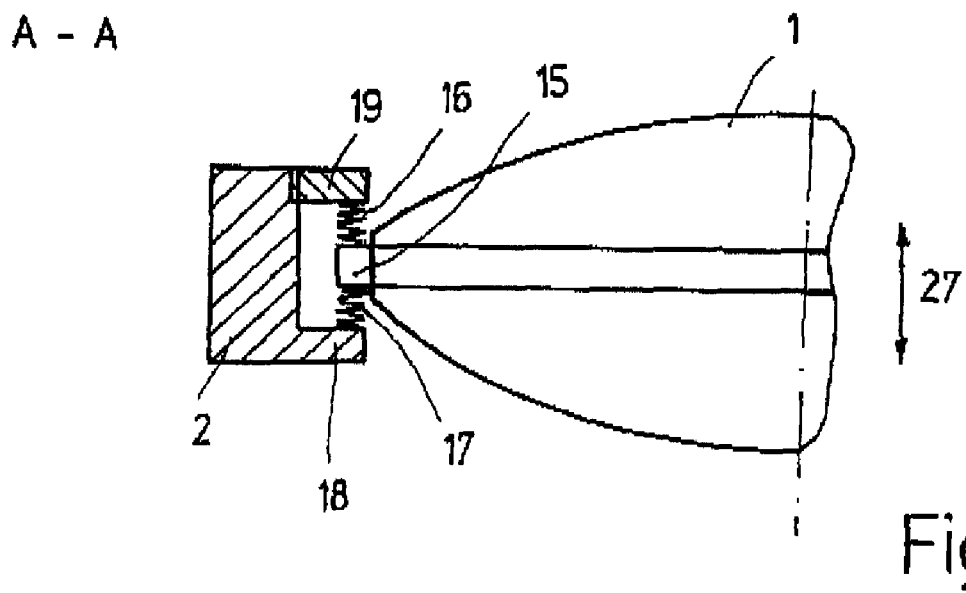
FIG. 2 shows a section view of a portion of the lens along the line A-A in FIG. 1.

With reference to FIG. 1 a lens 1 has an optical axis which extends in the direction of a double-headed arrow 27 (FIG. 2), and has support points or support elements on a socket 2 (FIG. 2) with first manipulators 3, 4, 5, which are preferably at equal distances from one another on the outer circumference of the lens 1, that is to say in each case 120° in the case of three support elements 3, 4, 5; however, other arrangements are also possible. Manipulators 6 to 14 are arranged in the area between the support elements 3, 4, 5, preferably likewise uniformly distributed.

For support, the lens 1 preferably—but not necessarily—has a peripheral ground projecting rim 15 (FIG. 2) which is supported both on its upper face and on its lower face between a spring 16 or 17, respectively, and an upper projection, which points radially inwards in the direction of the lens 1, and a lower projection 18 on the socket 2. In this case, an adjustment element 19, which is mounted in the socket 2, is preferably provided on the upper face instead of a projection from the socket 2, in order to vary the spring stress of the springs 16 and 17 and thus also to influence the stress acting on the lens 1, so that the birefringence in it is varied, and different polarization states are set. However, if no adjustment element is provided, the desired force of adjustment of the stresses in the lens 1 is governed by a suitable choice of the spring constants.

Figure 3:
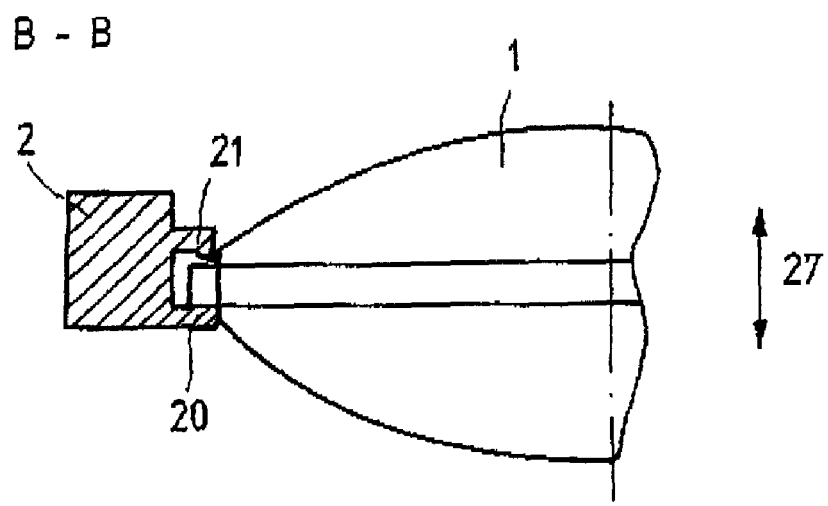
FIG. 3 shows a section view of a different portion from the lens, along the line B-B in FIG. 1.
Figure 4:
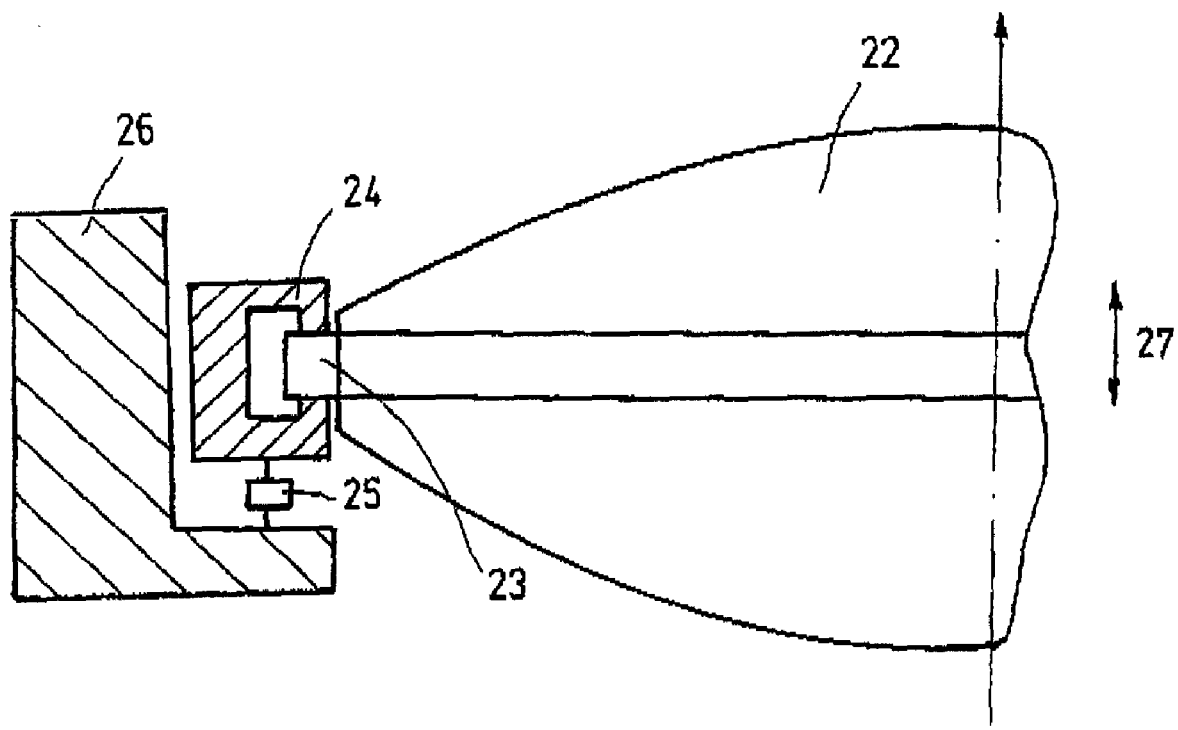
FIG. 4 shows a section view of a portion of another lens with active manipulators.

At other points, the lens 2 in each case rests without a spring on a projection 20 (FIG. 3) from the socket 2. Either a fixed upper projection 21 or an adjustment element for adjustment of the stress is also provided on the rim of the lens 1 at these points.

In another embodiment, a lens 22 is equipped with a peripheral projection 23, which is held at specific points by manipulators 24. For their part, the manipulators 24 have actuators 25 in the form of a spindle, of a piezoelectric, that is to say electrostrictive, element, or of another component which exerts a length change in the direction of the double-headed arrow 27, that is say in the direction of the optical axis, in order to introduce stresses into the lens 22. The manipulators 24, and together with them the lens 22, lie via the actuators 25 on an outer socket 26, which concentrically surrounds the lens 22.

Figure 5:
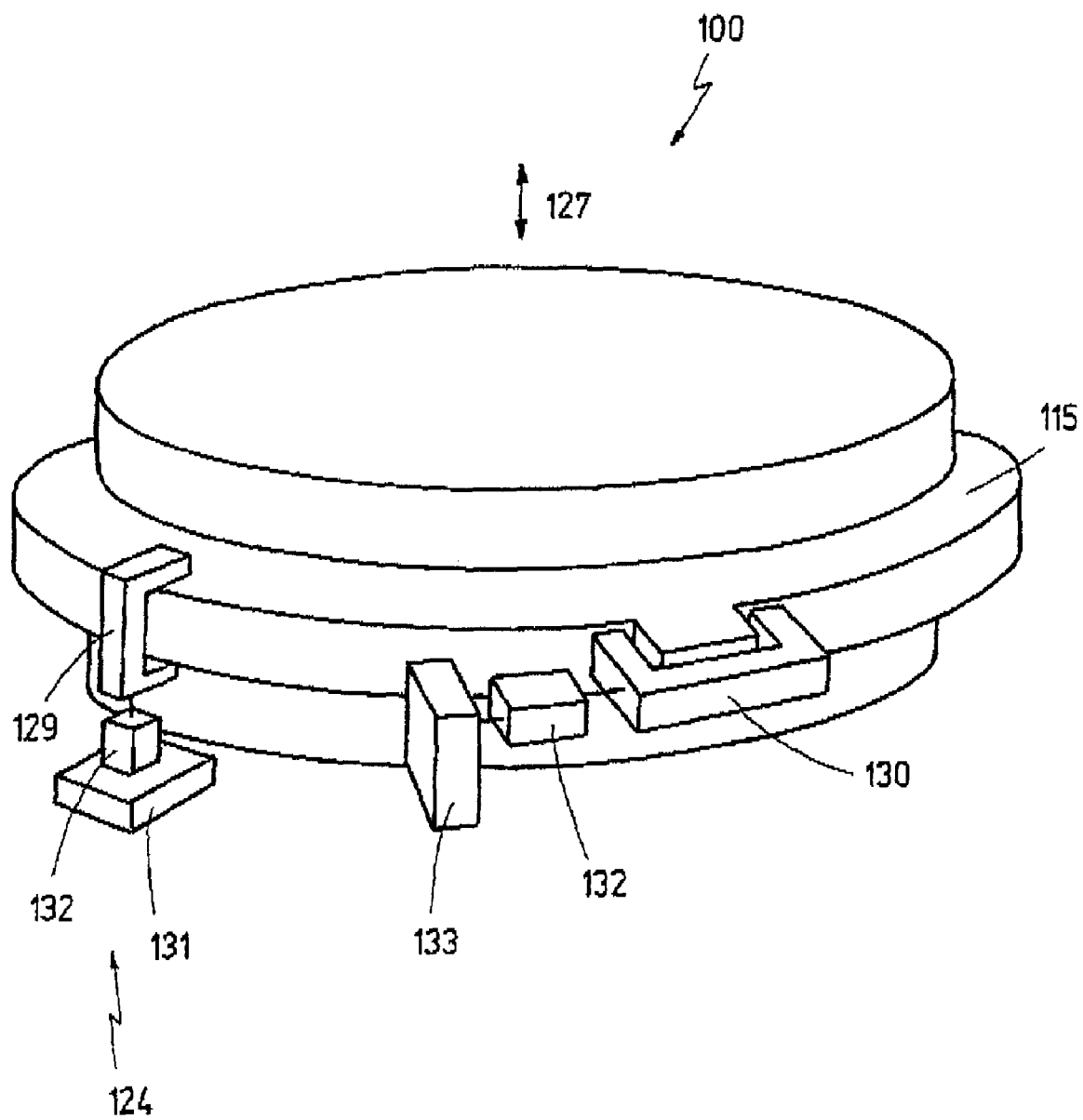
FIG. 5 a perspective view of an embodiment of a type of socket by which the lens is supported.

FIG. 5 shows an embodiment of a holder of a lens 100, wherein the lens 100 comprises a projecting rim 115 arranged on an outer periphery 128 of the lens 100. The lens 100 is supported in direction of the optical axis at the projecting rim 115 by means of holding elements which are arranged parallel to the optical axis of the lens 100 shown by a double arrow 127. FIG. 5 shows one holding element 129 only. The holding element 129 is assigned one of the manipulators 3, 4 and 5 of the lens 1 shown in FIG. 1, in each case.

It is also provided to arrange a second holding element 130 on the rim 115 of the lens 100, wherein the second holding element 130 is oriented essentially orthogonal to the first holding element 129. To this end, a projection is present on the rim 115 which is, at least partially, enclosed by the holding element 130.

The first holding element 129 is fixed on a socket ring 131 shown as rectangle in FIG. 5, which provides a common basis for the first holding element 129. A connection 132 between the holding element 129 and the socket ring 131 is schematically represented by a body 132. The holding elements 130 are also connected with a rigid supporting element 133, in each case.

In this connection, different embodiments of the connection are conceivable, which are described in detail in FIGS. 5 and 6 and 11 through 16 of the published US-patent application US 2003/0234918 A1, the description of which is incorporated in the disclosure of the present application by reference.

Thus, for the purposes of the present invention, the first component and the second component can be supported in one of the holders described in US 2003/0234918 A1 as well. Therefore, for a more detailed description of the holder, reference is made to the US-patent application mentioned before.

Figure 6:
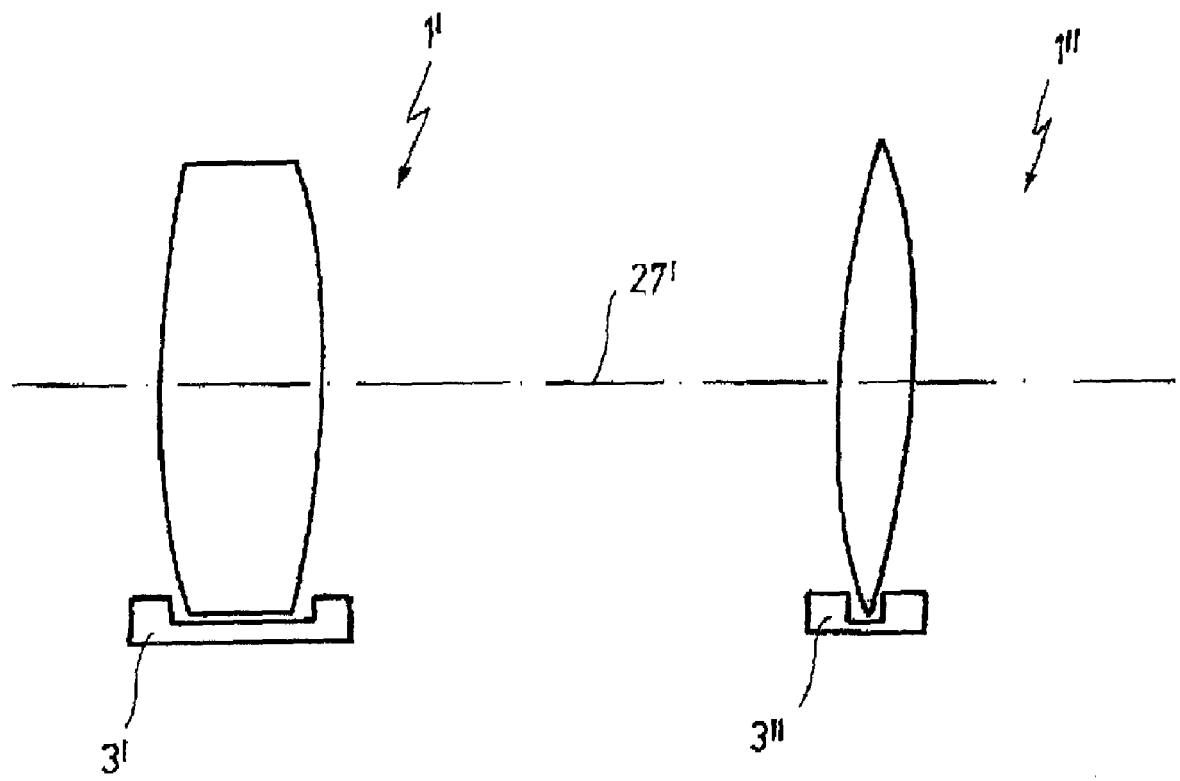
FIG. 6 shows a schematic representation of two optical components.

FIG. 6 schematically shows a first component in form of a lens 1' and a second optical component in form of a lens 1". The lens 1' is assigned a manipulator 3' and the lens 1" is assigned a manipulator 3". An optical axis is represented at 27'.

The lens 1' is thicker than the lens 1", wherein the lens 1" is easierly deformable than the lens 1'. The lens 1' and the lens 1" are optical components of an illumination system or a projection objective of a projection exposure apparatus for the microlithography.

Despite the lower thickness of the lens 1", its refractive power substantially equals the refractive power of the lens 1', which can be realized by different radii of curvature of the surfaces of the lenses 1' and 1".

While the force and/or torque exertion onto the lens 1' is adjusted such that stress birefringence is induced in the lens 1', forces and/or torques are exerted on the lens 1" via the manipulator 3", which predominantly have a scalar effect on the imaging properties of the lens 1" and which vary these scalar imaging properties.

For, when inducing stress birefringence in the lens 1', scalar imaging defects are produced in the same as well, and these scalar imaging defects which are produced by the lens 1', can then be compensated for by the manipulation of the lens 1".

The lens 1" preferably is an element which is easierly deformable than the lens 1', wherein the exertion of forces and/or torques in the lens 1' is smaller than the exertion of forces and/or torques in the lens 1'.

For inducing stress birefringence in the lens 1', forces in a range of about 1 to about 10 N and/or torques in a range of about 0.5 to about 1 Nm are exerted.

What is claimed is:

1. An optical apparatus, comprising
   an optical component having at least one optical surface and a first optical axis,
   a socket in which said optical component is mounted, and
   first manipulators arranged to exert forces approximately parallel to said optical axis of said optical component for varying stresses in said optical component, said forces having a strength such that stress birefringence is induced in said optical component;
   said optical component being a first optical component, and further comprising at least a second optical component having at least one optical surface and a second optical axis, and further comprising second manipulators arranged to exert second forces approximately parallel to said second optical axis of said second optical component for varying stresses in said second optical component, said second forces having a strength such that at least predominantly a scalar effect on imaging properties in said second optical component is induced.

2. The apparatus of claim 1, wherein said second forces are different from said first forces.

3. The apparatus of claim 1, wherein said first optical component comprises a material having a lower strain-optical coefficient than said second optical component.

4. The apparatus of claim 1, wherein said first optical component has a shape which is different from a shape of said second optical component.

5. The apparatus of claim 1, wherein said first optical component is a first lens, and said second optical component is a second lens, wherein said second lens has a thickness different form a thickness of said first lens, and wherein a refractive power of said first lens is at least approximately equal a refractive power of said second lens.

6. A method for influencing a polarization state of at least one optical component in a microlithographic projection exposure apparatus, said at least one optical component having an optical axis, comprising
   exerting forces on said at least one optical component such that stress birefringence is induced in said at least one optical component; wherein said at least one optical component is a first optical component, and
   exerting forces on at least a second optical component such that a scalar effect on imaging properties of said second optical component is produced in said second optical component which scalar effect at least partially compensates a scalar effect induced by said forces exerted on said first optical component.

7. The method of claim 6, wherein said forces exerted on said second optical component are lower than or equal the forces exerted on said first optical component.

8. The method of claim 6, wherein said first component comprises a material having a lower strain-optical coefficient than said second optical component.

9. The method of claim 6, wherein said first optical component has a shape which is different from a shape of said second optical component.

10. The method of claim 6, wherein said first optical component is a first lens, and said second optical component is a second lens, wherein said second lens has a thickness different from a thickness of said first lens, and wherein a refractive power of said first lens is at least approximately equal a refractive power of said second lens.

* * * * *